United States Patent
Choi et al.

(10) Patent No.: US 9,685,978 B2
(45) Date of Patent: Jun. 20, 2017

(54) SERIALIZER AND DATA TRANSMITTER COMPRISING THE SAME

(71) Applicant: Industry-Academic Cooperation Foundation, Yonsei University, Seoul (KR)

(72) Inventors: Woo-Young Choi, Seoul (KR); Sung-Geun Kim, Goyang-si (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 14/965,430

(22) Filed: Dec. 10, 2015

(65) Prior Publication Data

US 2016/0173274 A1 Jun. 16, 2016

(30) Foreign Application Priority Data

Dec. 10, 2014 (KR) .................. 10-2014-0177594

(51) Int. Cl.
*H04L 7/04* (2006.01)
*H03M 9/00* (2006.01)
*H04L 25/49* (2006.01)

(52) U.S. Cl.
CPC .......... *H03M 9/00* (2013.01); *H04L 25/4904* (2013.01)

(58) Field of Classification Search
CPC ....................................................... H04L 7/06
USPC ........................................................ 375/362
See application file for complete search history.

(56) References Cited

U.S. PATENT DOCUMENTS

| | | | |
|---|---|---|---|
| 5,142,408 A * | 8/1992 | Marshall | H01S 5/50 359/344 |
| 8,225,017 B1 | 7/2012 | Tang et al. | |
| 2008/0036502 A1* | 2/2008 | Lundberg | G11C 7/106 326/98 |
| 2015/0030112 A1* | 1/2015 | Wiley | H04L 25/0292 375/360 |

FOREIGN PATENT DOCUMENTS

| | | |
|---|---|---|
| JP | 2003133931 A | 9/2003 |
| KR | 10-1997-0004794 B1 | 3/1997 |
| KR | 10-1405241 B | 10/2014 |

OTHER PUBLICATIONS

Hankyu Chi, A Design of 20GBPS Lane Serial Link for Memory Interface Ph.D. Dissertation 2013 (148 pg.).
K. Fukuda et al., "A 12.3-mW 12.5-Gb/s Complete Transceiver in 65-nm CMOS Process", IEEE Journal of Solid-State Circuits, vol. 45:12, Dec. 2010, pp. 2838-2849 (12 pg.).
Y. Song et al., A 0.47-0.66 pJ/bit. 4.8-8 GB/s I/O Transceiver in 65 nm CMOS, IEEE Journal of Solid-State Circuits, vol. 48:5, May 2013, pp. 1276-1289 (14 pg.).

\* cited by examiner

*Primary Examiner* — Lihong Yu
(74) *Attorney, Agent, or Firm* — Procopio, Cory, Hargreaves & Savitch LLP

(57) ABSTRACT

Disclosed is a serializer, which includes a data signal alignment unit aligning a plurality of data signals with a predetermined phase interval, a transition detection unit detecting a transition of a logic level among the aligned data signals to generate a toggle signal at a transition of the logic level, and a toggle signal conversion unit converting the toggle signal into a serial data signal obtained by serializing the data signals.

13 Claims, 19 Drawing Sheets

SERIALIZER AND DATA TRANSMITTER COMPRISING THE SAME

CROSS-REFERENCE TO RELATED APPLICATIONS

A claim for priority under 35 U.S.C. §119 is made to Korean Patent Application No. 10-2014-0177594 filed Dec. 10, 2014, in the Korean Intellectual Property Office, the entire contents of which are hereby incorporated by reference.

BACKGROUND

Embodiments of the inventive concept described herein relate to a serializer and a data transmitter including the same.

As data throughput of a system is increasing, a demand for high-speed and low-power input/output is increasing. Accordingly, there are being made attempts to reduce power consumption while transmitting data in high speed at a transmitter. In general, a transmitter which transmits data includes a serializer, which converts a plurality of parallel data signals into a serial data stream and transmits the serial data stream to a receiver.

A conventional serializer serializes a plurality of data signals input in parallel by applying a clock and a pulse signal to the data signals. For example, a 4:1 serializer generates a pulse signal using a quadrature clock and synchronizes the pulse signal with a data signal to serialize four parallel data signals to a data stream.

Accordingly, the conventional serializer necessitates a circuit block for generating a pulse signal, a circuit block for adjusting a phase of the pulse signal, a circuit block for synchronizing the pulse signal with a data signal, and the like. In the case of a circuit block using a clock for serialization, as a speed of the clock becomes higher, power consumption becomes greater. Also, as the number of circuit blocks in a chip becomes greater, power consumption becomes greater.

SUMMARY

Embodiments of the inventive concept are directed to provide a serializer which reduces power consumption by excluding the use of clock and a data transmitter including the same.

Embodiments of the inventive concept are directed to provide a serializer which lowers complexity of design by implementing a circuit block for data serialization with logic gates using a standard cell and a data transmitter including the same.

Embodiments of the inventive concept are directed to provide a serializer which enables pre-emphasis by a simple circuit block by pre-emphasizing a serial data signal using a toggle signal generated during data serialization and a data transmitter including the same.

A serializer according to an embodiment of the present disclosure may include a data signal alignment unit aligning a plurality of data signals with a predetermined phase interval; a transition detection unit detecting a transition of a logic level among the aligned data signals to generate a toggle signal at a transition of the logic level; and a toggle signal conversion unit converting the toggle signal into a serial data signal obtained by serializing the data signals.

The data signal alignment unit may align the plurality of data signals so as to be spaced apart from each other by a phase difference which corresponds to a value obtained by dividing 360 degrees by the number of the data signals.

The data signal alignment unit may align the plurality of data signals so as to have the phase difference while converting the plurality of data signals in a return to zero (RZ) manner.

The data signal alignment unit may include a plurality of flip-flops, each of which receives a data signal, a clock signal, and a reset signal and outputs an RZ data signal, obtained by converting the data signal in the RZ manner, and an inverted RZ data signal, corresponding to an inverted version of the RZ data signal, in response to a timing of the clock signal and the reset signal. A phase difference corresponding to the phase interval may exist among the clock signals respectively applied to the flip-flops, and a phase difference corresponding to the phase interval may exist among the reset signals respectively applied to the flip-flops.

The transition detection unit may compare logic levels of two data signals, of which the phases are continuous, from among the aligned data signals at the same timing. The transition detection unit may generate a positive toggle signal when a logic level of a data signal of which the phase leads is "0" and a logic level of a data signal of which the phase lags is "1" and may generate a negative toggle signal when a logic level of a data signal of which the phase leads is "1" and a logic level of a data signal of which the phase lags is "0".

The transition detection unit may include a plurality of first NAND gates, each of which receives two data signals, of which the phases are continuous, from among the aligned data signals and performs a NAND operation with respect to an RZ data signal of a data signal, of which the phase leads, and an inverted RZ data signal of a data signal of which the phase lags; a plurality of second NAND gates, each of which receives two data signals, of which the phases are continuous, from among the aligned data signals and performs a NAND operation with respect to an inverted RZ data signal of a data signal, of which the phase leads, and an RZ data signal of a data signal of which the phase lags; a third NAND gate which performs a NAND operation with respect to output signals of the first NAND gates; and a fourth NAND gate which performs a NAND operation with respect to output signals of the second NAND gates.

The toggle signal conversion unit may include a NOR gate SR latch which receives the positive toggle signal and the negative toggle signal and outputs the serial data signal and an inverted serial data signal corresponding to an inverted version of the serial data signal.

The data signal alignment unit may align the plurality of data signals so as to have the phase difference while converting the plurality of data signals in a return to one (RO) manner.

The data signal alignment unit may include a plurality of flip-flops, each of which receives a data signal, a clock signal, and a reset signal and outputs an RO data signal, converted according to the RO manner, and an inverted RO data signal, corresponding to an inverted version of the RO data signal, in response to a timing of the clock signal and the reset signal. A phase difference corresponding to the phase interval may exist among the clock signals respectively applied to the flip-flops, and a phase difference corresponding to the phase interval may exist among the reset signals respectively applied to the flip-flops.

The transition detection unit may include compare logic levels of two data signals, of which the phases are continuous, from among the aligned data signals at the same timing. The transition detection unit may generate a positive toggle signal when a logic level of a data signal of which the phase leads is "1" and a logic level of a data signal of which the phase lags is "0" and may generate a negative toggle signal when a logic level of a data signal of which the phase leads is "0" and a logic level of a data signal of which the phase lags is "1".

The transition detection unit may include a plurality of first NOR gates, each of which receives two data signals, of which the phases are continuous, from among the aligned data signals and performs a NOR operation with respect to an RO data signal of a data signal, of which the phase leads, and an inverted RO data signal of a data signal of which the phase lags; a plurality of second NOR gates, each of which receives two data signals, of which the phases are continuous, from among the aligned data signals and performs a NOR operation with respect to an inverted RO data signal of a data signal, of which the phase leads, and an RO data signal of a data signal of which the phase lags; a third NOR gate which performs a NOR operation with respect to output signals of the first NOR gates; and a fourth NOR gate which performs a NOR operation with respect to output signals of the second NOR gates.

The toggle signal conversion unit may include a NAND gate SR latch which receives the positive toggle signal and the negative toggle signal and outputs the serial data signal and an inverted serial data signal corresponding to an inverted version of the serial data signal.

A serializer according to an embodiment of the inventive concept may include a plurality of flip-flops, each of which receives a data signal, a clock signal, and a reset signal and outputs an RZ data signal, obtained by converting the data signal in the RZ manner, and an inverted RZ data signal, corresponding to an inverted version of the RZ data signal, in response to a timing of the clock signal and the reset signal; a plurality of first NAND gates, each of which receives two data signals, of which the phases are continuous, from among the aligned data signals and performs a NAND operation with respect to an RZ data signal of a data signal, of which the phase leads, and an inverted RZ data signal of a data signal of which the phase lags; a plurality of second NAND gates, each of which receives two data signals, of which the phases are continuous, from among the aligned data signals and performs a NAND operation with respect to an inverted RZ data signal of a data signal, of which the phase leads, and an RZ data signal of a data signal of which the phase lags; a third NAND gate which performs a NAND operation with respect to output signals of the first NAND gates; and a fourth NAND gate which performs a NAND operation with respect to output signals of the second NAND gates; and a NOR gate SR latch which receives the positive toggle signal and the negative toggle signal and outputs the serial data signal and an inverted serial data signal corresponding to an inverted version of the serial data signal. A phase difference corresponding to the phase interval may exist among the clock signals respectively applied to the flip-flops, and a phase difference corresponding to the phase interval may exist among the reset signals respectively applied to the flip-flops.

A serializer according to an embodiment of the inventive concept may include a plurality of flip-flops, each of which receives a data signal, a clock signal, and a reset signal and outputs an RO data signal, converted according to the RO manner, and an inverted RO data signal, corresponding to an inverted version of the RO data signal, in response to a timing of the clock signal and the reset signal; a plurality of first NOR gates, each of which receives two data signals, of which the phases are continuous, from among the aligned data signals and performs a NOR operation with respect to an RO data signal of a data signal, of which the phase leads, and an inverted RO data signal of a data signal of which the phase lags; a plurality of second NOR gates, each of which receives two data signals, of which the phases are continuous, from among the aligned data signals and performs a NOR operation with respect to an inverted RO data signal of a data signal, of which the phase leads, and an RO data signal of a data signal of which the phase lags; a third NOR gate which performs a NOR operation with respect to output signals of the first NOR gates; and a fourth NOR gate which performs a NOR operation with respect to output signals of the second NOR gates; and a NAND gate SR latch which receives the positive toggle signal and the negative toggle signal and outputs the serial data signal and an inverted serial data signal corresponding to an inverted version of the serial data signal. A phase difference corresponding to the phase interval may exist among the clock signals respectively applied to the flip-flops, and a phase difference corresponding to the phase interval may exist among the reset signals respectively applied to the flip-flops.

A data transmitter according to an embodiment of the present disclosure may include a serializer which includes a data signal alignment unit aligning a plurality of data signals with a predetermined phase interval; a transition detection unit detecting a transition of a logic level among the aligned data signals to generate a toggle signal at a transition of the logic level; and a toggle signal conversion unit converting the toggle signal into a serial data signal obtained by serializing the data signals; an output driver which compensates for a channel loss of the serial data signal; and a pre-emphasis unit which receives the toggle signal to generate an emphasis signal in an input section of the toggle signal and makes the emphasis signal overlapped with an output signal from the output driver.

The data signal alignment unit may align the plurality of data signals so as to have the phase difference while converting the plurality of data signals in a return to zero (RZ) manner.

The data signal alignment unit may include a plurality of flip-flops, each of which receives a data signal, a clock signal, and a reset signal and outputs an RZ data signal, obtained by converting the data signal in the RZ manner, and an inverted RZ data signal, corresponding to an inverted version of the RZ data signal, in response to a timing of the clock signal and the reset signal. A phase difference corresponding to the phase interval may exist among the clock signals respectively applied to the flip-flops, and a phase difference corresponding to the phase interval may exist among the reset signals respectively applied to the flip-flops.

The transition detection unit may include compare logic levels of two data signals, of which the phases are continuous, from among the aligned data signals at the same timing. The transition detection unit may generate a positive toggle signal when a logic level of a data signal of which the phase leads is "0" and a logic level of a data signal of which the phase lags is "1" and may generate a negative toggle signal when a logic level of a data signal of which the phase leads is "1" and a logic level of a data signal of which the phase lags is "0".

The transition detection unit may include a plurality of first NAND gates, each of which receives two data signals, of which the phases are continuous, from among the aligned data signals and performs a NAND operation with respect to an RZ data signal of a data signal, of which the phase leads, and an inverted RZ data signal of a data signal of which the phase lags; a plurality of second NAND gates, each of which receives two data signals, of which the phases are continuous, from among the aligned data signals and performs a NAND operation with respect to an inverted RZ data signal of a data signal, of which the phase leads, and an RZ data signal of a data signal of which the phase lags; a third NAND gate which performs a NAND operation with respect to output signals of the first NAND gates; and a fourth NAND gate which performs a NAND operation with respect to output signals of the second NAND gates.

The toggle signal conversion unit may include a NOR gate SR latch which receives the positive toggle signal and the negative toggle signal and outputs the serial data signal and an inverted serial data signal corresponding to an inverted version of the serial data signal.

The data signal alignment unit may align the plurality of data signals so as to have the phase difference while converting the plurality of data signals in a return to one (RO) manner.

The data signal alignment unit may include a plurality of flip-flops, each of which receives a data signal, a clock signal, and a reset signal and outputs an RO data signal, converted according to the RO manner, and an inverted RO data signal, corresponding to an inverted version of the RO data signal, in response to a timing of the clock signal and the reset signal. A phase difference corresponding to the phase interval may exist among the clock signals respectively applied to the flip-flops, and a phase difference corresponding to the phase interval may exist among the reset signals respectively applied to the flip-flops.

The transition detection unit may include compare logic levels of two data signals, of which the phases are continuous, from among the aligned data signals at the same timing. The transition detection unit may generate a positive toggle signal when a logic level of a data signal of which the phase leads is "1" and a logic level of a data signal of which the phase lags is "0" and may generate a negative toggle signal when a logic level of a data signal of which the phase leads is "0" and a logic level of a data signal of which the phase lags is "1".

The transition detection unit may include a plurality of first NOR gates, each of which receives two data signals, of which the phases are continuous, from among the aligned data signals and performs a NOR operation with respect to an RO data signal of a data signal, of which the phase leads, and an inverted RO data signal of a data signal of which the phase lags; a plurality of second NOR gates, each of which receives two data signals, of which the phases are continuous, from among the aligned data signals and performs a NOR operation with respect to an inverted RO data signal of a data signal, of which the phase leads, and an RO data signal of a data signal of which the phase lags; a third NOR gate which performs a NOR operation with respect to output signals of the first NOR gates; and a fourth NOR gate which performs a NOR operation with respect to output signals of the second NOR gates.

The toggle signal conversion unit may include a NAND gate SR latch which receives the positive toggle signal and the negative toggle signal and outputs the serial data signal and an inverted serial data signal corresponding to an inverted version of the serial data signal.

The pre-emphasis unit may include first and second NMOS transistors connected in series between a first power terminal, having a potential corresponding to a logic level of "1", and a second power terminal, having a potential corresponding to a logic level of "0", and third and fourth NMOS transistors connected in series between the first power terminal and the second power terminal. The first and fourth NMOS transistors may be switched on or off according to the positive toggle signal, and the second and third NMOS transistors may be switched on or off according to the negative toggle signal.

The pre-emphasis unit may include first and second PMOS transistors connected in series between a first power terminal, having a potential corresponding to a logic level of "1", and a second power terminal, having a potential corresponding to a logic level of "0", and third and fourth PMOS transistors connected in series between the first power terminal and the second power terminal. The first and fourth PMOS transistors may be switched on or off according to the positive toggle signal, and the second and third PMOS transistors may be switched on or off according to the negative toggle signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
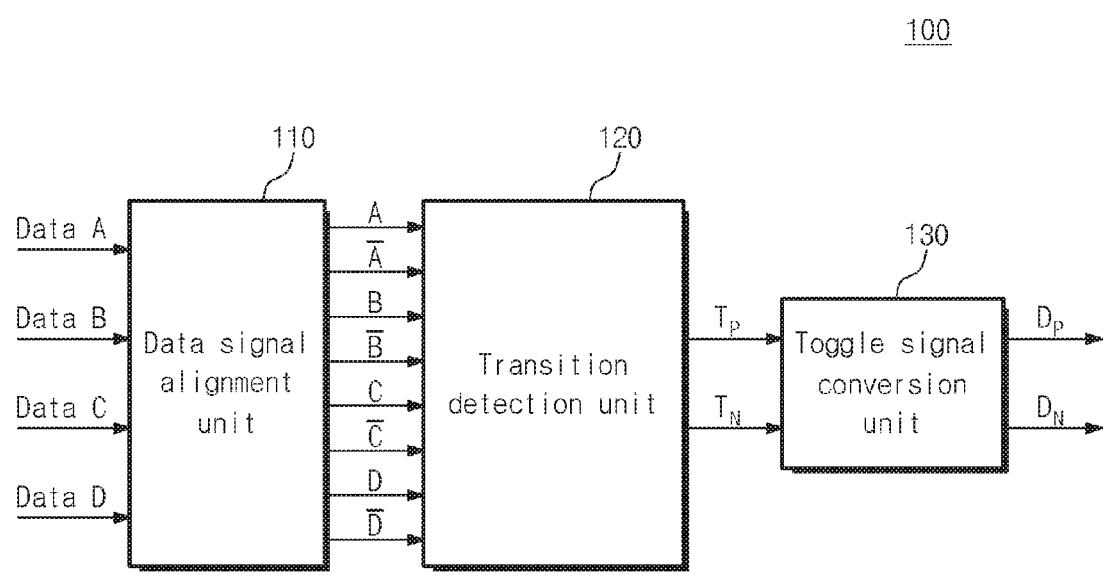
FIG. 1 is a block diagram illustrating a serializer according to an embodiment of the inventive concept.

Advantage points and features of the invention disclosure and a method of accomplishing thereof will become apparent from the following description with reference to the following figures, wherein embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. The inventive concept may be defined by scope of the claims. Meanwhile, the terminology used herein to describe embodiments of the invention is not intended to limit the scope of the invention.

Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

Terms used in this specification are used to describe specified embodiments of the present disclosure and are not intended to limit the scope of the present disclosure. The terms of a singular form may include plural forms unless otherwise specified. In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features. As used herein, the term "and/or" includes any and all combinations of one or more of the associated listed items.

Unlike a conventional manner for data serialization, a serializer according to an embodiment of the inventive concept may use a clock only in aligning a data signal and may exclude the use of the clock in serializing a data signal, and thus power consumption may be reduced.

In an embodiment, the serializer according to an embodiment of the inventive concept may serialize parallel data by aligning a plurality of parallel data signals, generating a toggle signal as a result of detecting a transition of a logic level among aligned data signals, and converting the toggle signal into a serial data signal.

According to an embodiment of the inventive concept, a circuit used for data serialization may be implemented with logic gates, and thus the circuit may be easy to design. Circuit blocks for pulse phase adjustment and synchronization between a pulse and a data signal may not be required, thereby making it possible to serialize data with low power.

According to an embodiment of the inventive concept, also, since a toggle signal indicating a transition of a logic level among data signals is generated during the procedure for serializing data, a serial data signal may be pre-emphasized using the toggle signal. Thus, pre-emphasis may be provided through a simple circuit block.

Below, embodiments of the inventive concept will be more fully described with reference to accompanying drawings.

FIG. 1 is a block diagram illustrating a serializer 100 according to an embodiment of the inventive concept.

As illustrated in FIG. 1, a serializer 100 may include a data signal alignment unit 110, a transition detection unit 120, and a toggle signal conversion unit 130.

The data signal alignment unit 110 may align a plurality of data signals A to D with a predetermined phase interval. The transition detection unit 120 may detect a transition of logic levels among the aligned data signals A to D and may generate toggle signals $T_P$ and $T_N$ when the logical levels transition. The toggle signal conversion unit 130 may convert the toggle signals $T_P$ and $T_N$ into a serial data signal $D_P$ which is obtained by serializing the data signals.

The data signal alignment unit 110 may align the plurality of data signals A to D so as to be spaced apart from each other by a predetermined phase interval. According to an embodiment, the data signal alignment unit 110 may align the plurality of data signals A to D so as to be spaced apart from each other by a phase difference which corresponds to a value obtained by dividing 360 degrees by the number of the data signals.

For example, as illustrated in FIG. 1, in the case where four data signals A to D are serialized to one data stream, the data signal alignment unit 110 may align the data signals A to D so as to be spaced apart from each other by 90 degrees.

In this specification, an embodiment of the inventive concept will be focused on a circuit configuration for 4:1 serialization and an operation thereof. However, the scope and spirit of the inventive concept may not be limited thereto. For example, the scope and spirit of the inventive concept may be applied to various kinds of serialization including 2:1 serialization.

According to an embodiment, the data signal alignment unit 110 may align the plurality of data signals A to D so as to have the phase difference while converting the plurality of data signals A to D in a return to zero (RZ) manner.

The RZ manner may refer to a manner in which each of pulses constituting a data signal returns to a voltage corresponding to a logic level of "0" and may be a signal implementation manner which is opposite to a none return to zero (NRZ) manner in which there is no need to return to a voltage corresponding to a logic level of "0".

A return to one (RO) manner may refer to a manner in which each of pulses constituting a data signal returns to a voltage corresponding to a logic level of "1". Unlike the RZ or NRZ manner which expresses data on the basis of a voltage corresponding to a logic level of "0", the RO manner may express data on the basis of a voltage corresponding to a logic level of "1".

Figure 2:
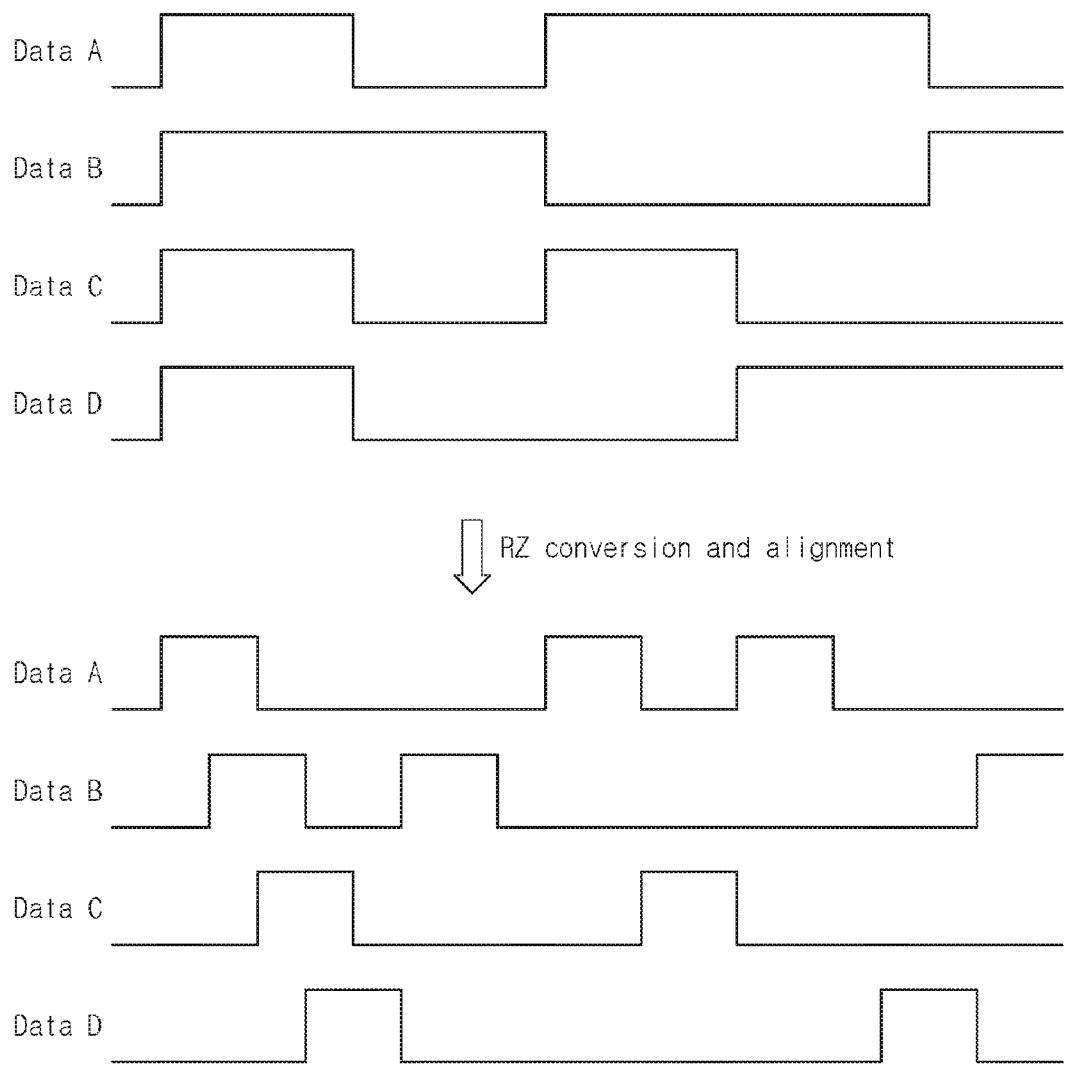
FIG. 2 is a diagram for describing the procedure in which a data signal alignment unit according to an embodiment of the inventive concept aligns data signals while converting the data signals in an RZ manner.

FIG. 2 is a diagram for describing the procedure in which a data signal alignment unit 110 according to an embodiment of the inventive concept aligns data signals A to D while converting the data signals A to D in an RZ manner.

As illustrated in FIG. 2, the data signal alignment unit 110 may sequentially align a plurality of data signals A to D with a predetermined phase difference, that is, 90 degrees and may convert the data signals A to D, expressed in the NRZ manner, in the RZ manner.

With the above-described manner, the data signals A to D may be arranged with a phase difference of 90 degrees in the following order: a first data signal A, a second data signal B, a third data signal C, and a fourth data signal D.

Figure 3:
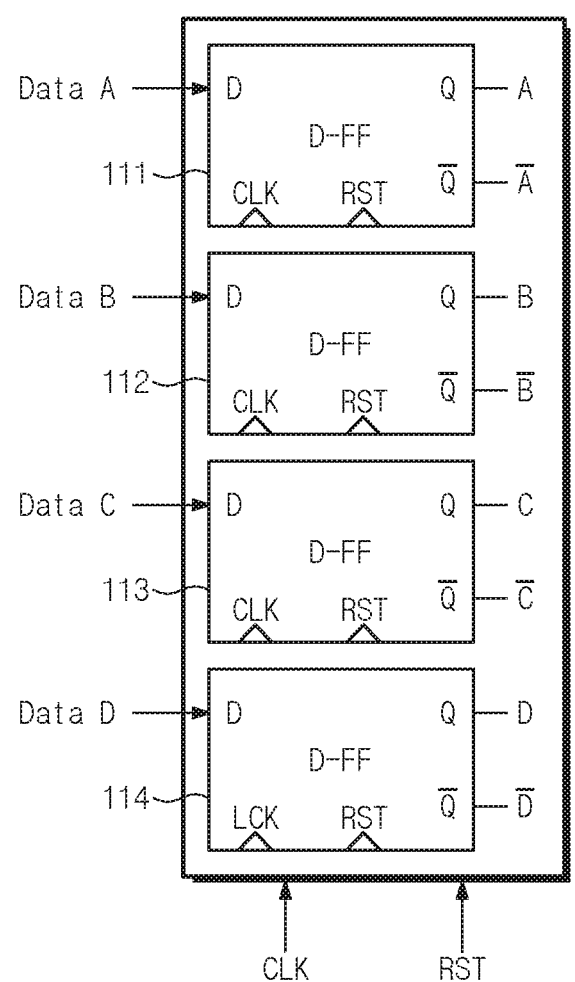
FIG. 3 is a diagram illustrating a configuration of a data signal alignment unit according to an embodiment of the inventive concept.

FIG. 3 is a diagram illustrating a configuration of a data signal alignment unit 110 according to an embodiment of the inventive concept.

As illustrated in FIG. 3, according to an embodiment of the inventive concept, the data signal alignment unit 110 may include a plurality of flip-flops 111 to 114. Each flip-flop may receive a data signal D, a clock signal CLK, and a reset signal RST and may output an RZ data signal Q, converted according to the RZ manner, and an inverted RZ data signal /Q, corresponding to an inverted version of the RZ data signal Q, in response to the clock signal CLK and the reset signal RST.

That is, after receiving the data signal D, each flip-flop may output the data signal when the clock signal CLK is received; if the reset signal RST is received, each flip-flop may output a signal corresponding to a logic level of "0" and may convert a data signal in the RZ manner, not the NRZ manner.

Furthermore, to align the data signals A to D with a predetermined phase interval, a phase difference (e.g., 90 degrees in the case of FIG. 3) corresponding to the phase interval may exist among the clock signals CLK respectively applied to the flip-flops 111 to 114, and a phase difference (e.g., 90 degrees in the case of FIG. 3) corresponding to the phase interval may exist among the reset signals RST respectively applied to the flip-flops 111 to 114.

The transition detection unit 120 may detect a transition of a logic level among the aligned data signals A to D and may generate toggle signals $T_P$ and $T_N$ when the logic level transitions.

According to an embodiment of the inventive concept, the transition detection unit 120 may compare logic levels of two data signals, of which the phases are continuous, from among the aligned data signals A to D at the same timing. A positive toggle signal $T_P$ may be generated when a logic level of a data signal of which the phase leads is "0" and a logic level of a data signal of which the phase lags is "1", and a negative toggle signal $T_N$ may be generated when a logic level of a data signal of which the phase leads is "1" and a logic level of a data signal of which the phase lags is "0".

Figure 4:
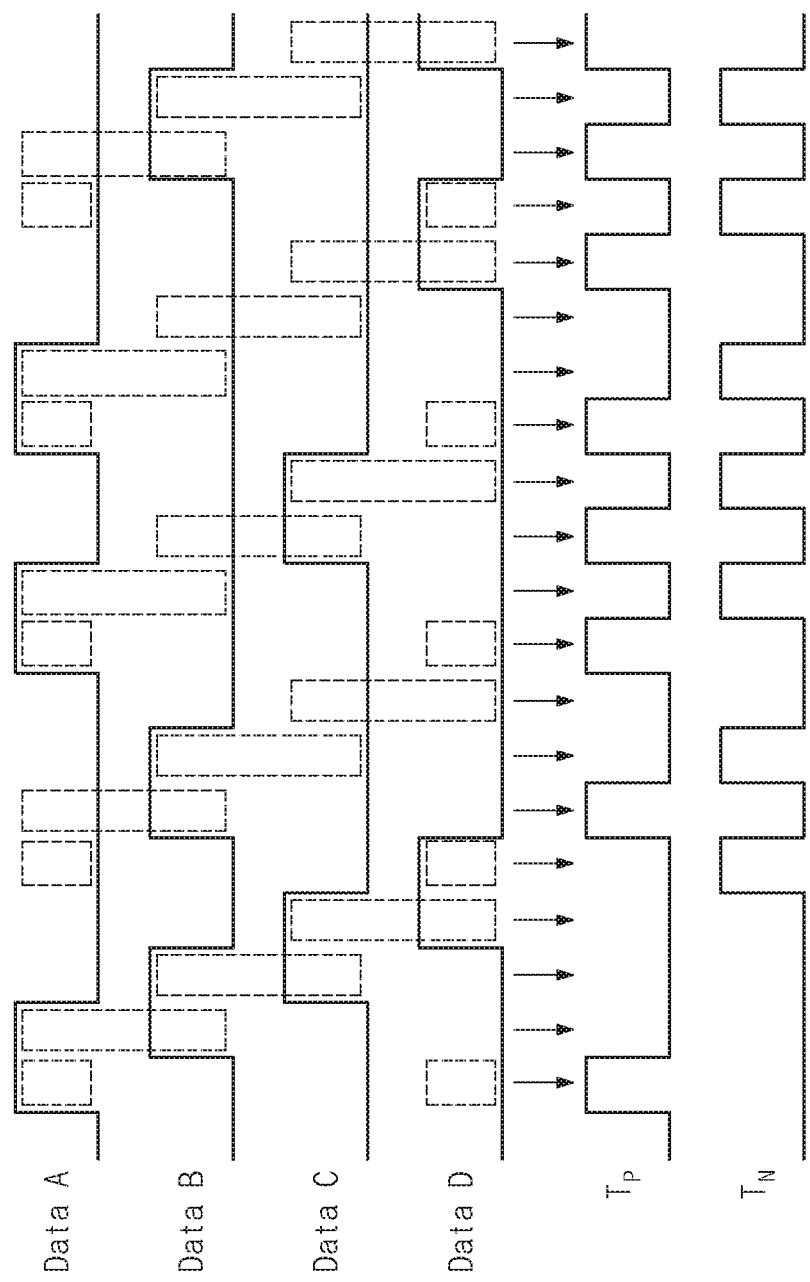
FIG. 4 is a diagram for describing the procedure in which a transition detection unit according to an embodiment of the inventive concept detects a transition of a logic level among data signals and generates toggle signals as the detection result.

FIG. 4 is a diagram for describing the procedure in which a transition detection unit 120 according to an embodiment of the inventive concept detects a transition of a logic level among data signals A to D and generates toggle signals $T_P$ and $T_N$ as the detection result.

According to an embodiment, the transition detection unit 120 may compare logic levels of two data signals among data signals A to D of the RZ manner, aligned with a predetermined phase interval, in order of phase at the same timing.

For example, referring to FIG. 4, the transition detection unit 120 may compare logic levels of two data signals among the data signals A to D at the same timing in the following order: a first step of comparing a logic level of the fourth data signal D and a logic level of the first data signal A, a second step of comparing a logic level of the first data signal A and a logic level of the second data signal B, a third step of comparing a logic level of the second data signal B and a logic level of the third data signal C, and a fourth step of comparing a logic level of the third data signal C and a logic level of the fourth data signal D.

According to an embodiment of the inventive concept, the transition detection unit 120 may generate a positive toggle signal $T_P$ when a logic level of a data signal of which the phase leads is "0" and a logic level of a data signal of which the phase lags is "1" and may generate a negative toggle signal $T_N$ when a logic level of a data signal of which the phase leads is "1" and a logic level of a data signal of which the phase lags is "0".

For example, referring to FIG. 4, in the first comparing step, since the fourth data signal D and the first data signal A have a logic level of "0" and a logic level of "1", respectively, the transition detection unit 120 may generate the positive toggle signal TP.

In the second comparing step, since each of the first data signal A and the second data signal B has a logic level of "1", the transition detection unit 120 may not generate a toggle signal. In the third and fourth comparing steps, since each of the second data signal B, the third data signal C, and the fourth data signal D has a logic level of "1", the transition detection unit 120 may not generate a toggle signal.

In a fifth comparing step, since the fourth data signal D and the first data signal A have a logic level of "1" and a logic level of "0", respectively, the transition detection unit 120 may generate the negative toggle signal $T_N$.

The transition detection unit 120 may perform comparison with respect to the aligned data signals A to D in the above-described manner in which logic levels of two data signals are sequentially compared in order of phase and may generate a negative or positive toggle signal $T_N$ or $T_P$ indicating of a transition of a logic level.

Figure 5:
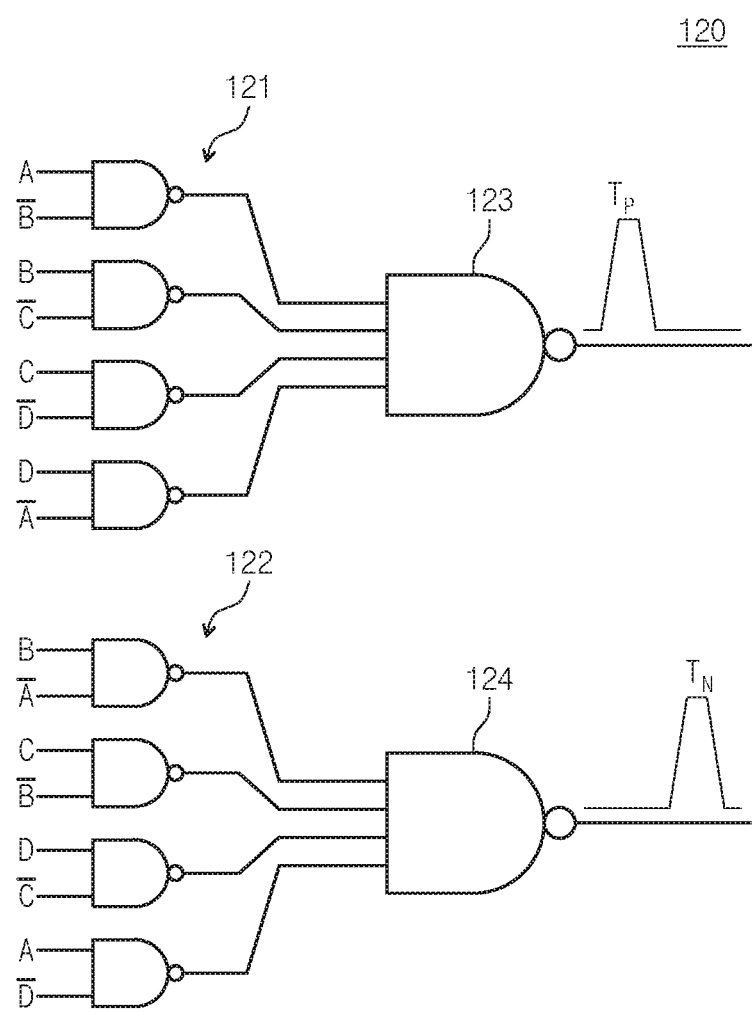
FIG. 5 is a circuit diagram illustrating a configuration of a transition detection unit according to an embodiment of the inventive concept.

FIG. 5 is a circuit diagram illustrating a configuration of a transition detection unit 120 according to an embodiment of the inventive concept.

According to an embodiment of the inventive concept, the transition detection unit 120 may be implemented with a combination of NAND gates.

For example, as illustrated in FIG. 5, the transition detection unit 120 may include a plurality of first NAND gates 121, each of which receives two data signals, of which the phases are continuous, from among the aligned data signals A to D and performs a NAND operation with respect to an RZ data signal of a data signal, of which the phase leads, and an inverted RZ data signal of a data signal of which the phase lags; a plurality of second NAND gates 122, each of which receives two data signals, of which the phases are continuous, from among the aligned data signals A to D and performs a NAND operation with respect to an inverted RZ data signal of a data signal, of which the phase leads, and an RZ data signal of a data signal of which the phase lags; a third NAND gate 123 which performs a NAND operation with respect to output signals of the first NAND gates 121; and a fourth NAND gate 124 which performs a NAND operation with respect to output signals of the second NAND gates 122.

As such, the transition detection unit 120 may receive RZ data signals A, B, C, and D and inverted RZ data signals /A, /B, /C, and /D of the aligned data signals A, B, C, and D from the data signal alignment unit 110 and may detect a transition of a logic level to generate toggle signals $T_P$ or $T_N$.

The toggle signal conversion unit 130 may convert the toggle signals $T_P$ and $T_N$ into a signal data signal $D_P$ which is obtained by serializing the data signals A to D.

Figure 6:
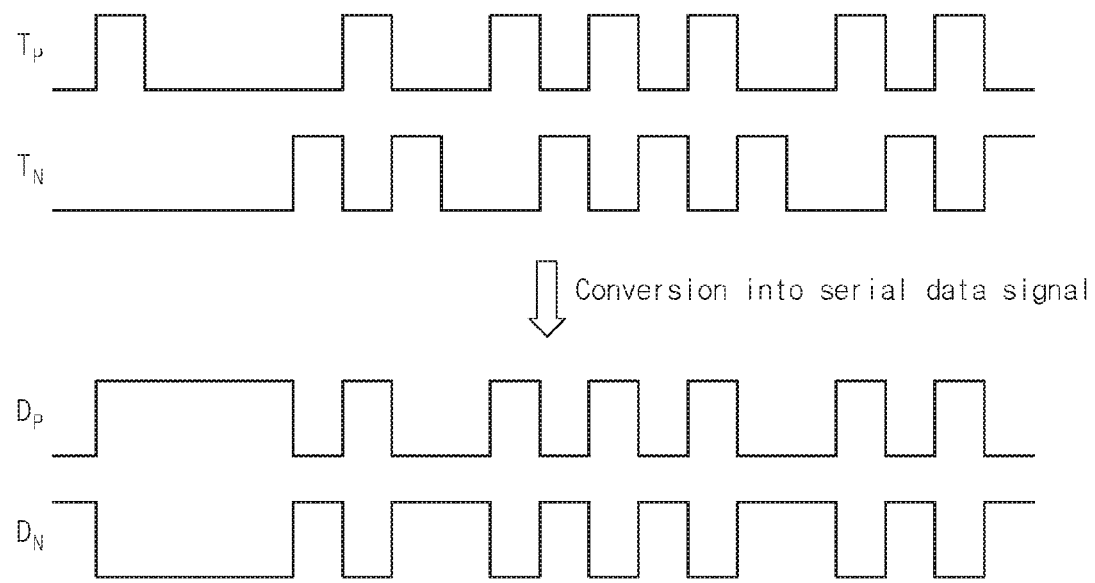
FIG. 6 is a diagram for describing the procedure in which a toggle signal conversion unit according to an embodiment of the inventive concept converts toggle signals into a serial data signal.

FIG. 6 is a diagram for describing the procedure in which a toggle signal conversion unit 130 according to an embodiment of the inventive concept converts toggle signals $T_P$ and $T_N$ into a serial data signal DP.

As illustrated in FIG. 6, the toggle signal conversion unit 130 may receive the toggle signals $T_P$ and $T_N$ from the transition detection unit 120 and may convert the toggle signals $T_P$ and $T_N$ into a signal data signal $D_P$ which is obtained by serializing a plurality of parallel data signals A to D.

As described above, the positive toggle signal $T_P$ may have timing information indicating that a logic level between two data signals of which the phases are continuous transitions from "0" to "1", and the negative toggle signal $T_N$ may have timing information indicating that a logic level between two data signals of which the phases are continuous transitions from "1" to "0". Thus, the toggle signal conversion unit 130 may generate a serial data signal $D_P$ and an inverted serial data signal DN, corresponding to an inverted version of the serial data signal DP, based on the positive and negative toggle signals $T_P$ and $T_N$.

According to an embodiment of the inventive concept, the toggle signal conversion unit 130 may be implemented with a set-reset (SR) latch and may generate a serial data signal $D_P$ and an inverted serial data signal DN from the positive and negative toggle signals $T_P$ and $T_N$.

Figure 7:
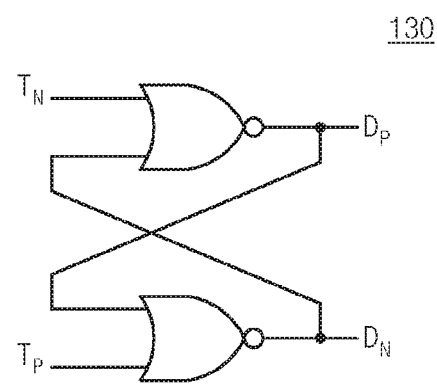
FIGS. 7 and 8 are circuit diagrams illustrating a configuration of a toggle signal conversion unit according to an embodiment of the inventive concept.
Figure 8:
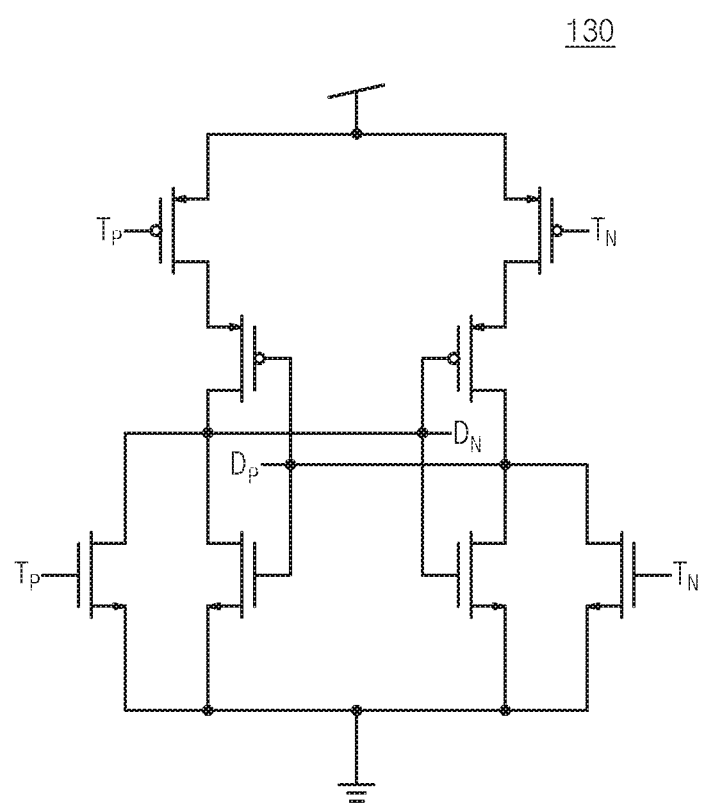

FIGS. 7 and 8 are circuit diagrams illustrating a configuration of a toggle signal conversion unit 130 according to an embodiment of the inventive concept.

The toggle signal conversion unit 130 may include an SR latch which receive positive and negative toggle signals $T_P$ and $T_N$ and outputs a serial data signal $D_P$ and an inverted serial data signal DN.

For example, as illustrated in FIG. 7, the toggle signal conversion unit 130 may include an SR latch implemented with NOR gates, and an example in which the NOR gate SR latch are implemented with PMOS and NMOS transistors are illustrated in FIG. 8.

Figure 9:
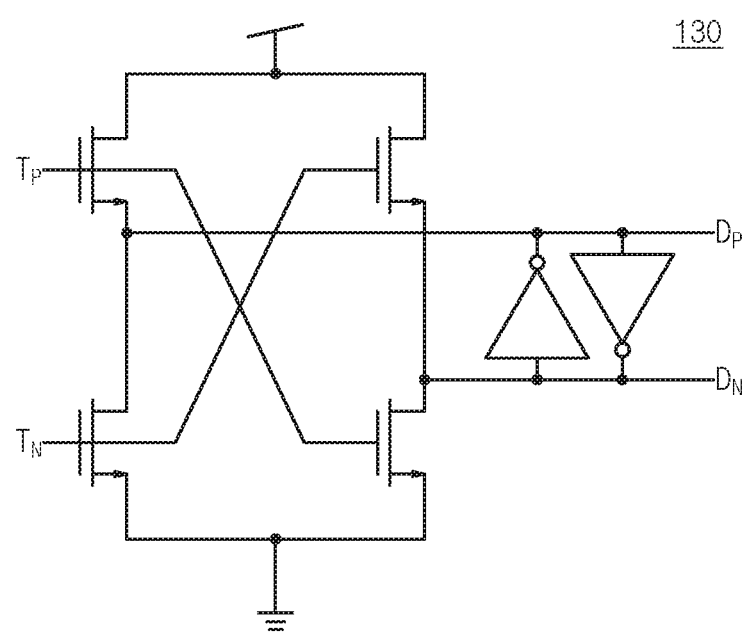
FIGS. 9 and 10 are circuit diagrams illustrating a configuration of a toggle signal conversion unit according to another embodiment of the inventive concept.
Figure 10:
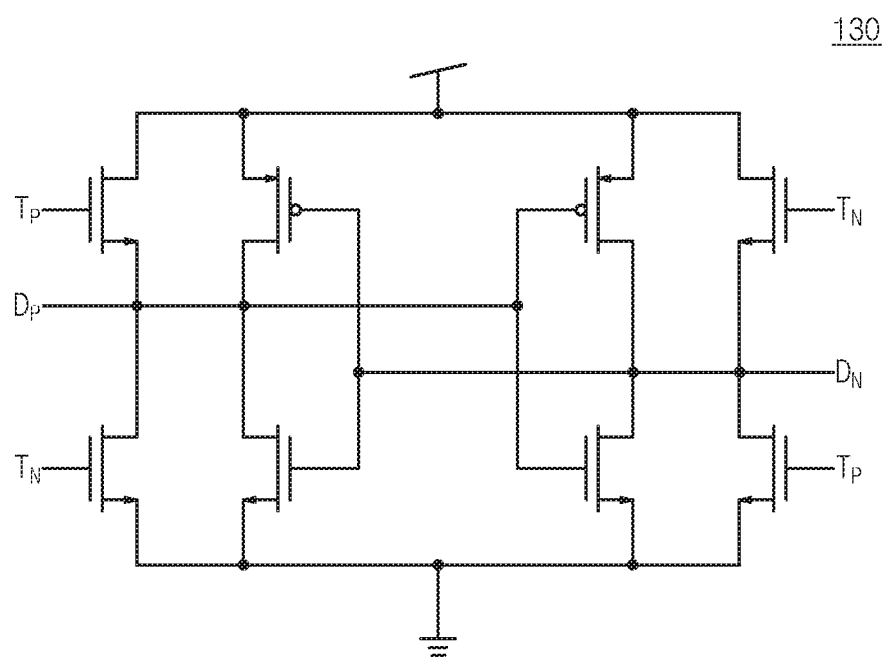

FIGS. 9 and 10 are circuit diagrams illustrating a configuration of a toggle signal conversion unit 130 according to another embodiment of the inventive concept.

Unlike a NOR gate SR latch of a 3-stack structure illustrated in FIGS. 7 and 8, the toggle signal conversion unit 130 illustrated in FIGS. 9 and 10 may have a 2-stack structure. The toggle signal conversion unit 130 may receive toggle signals $T_P$ and $T_N$ only by NMOS transistors and may include two inverters.

As such, the toggle signal conversion unit 130 may receive positive and negative toggle signals $T_P$ and $T_N$ through an SR latch, which are able to be implemented with various circuit structures, and may generate a serial data signal $D_P$ and an inverted serial data signal DN based on information about a transition of a logic level among parallel data signals A to D.

As described above, the serializer 100 according to an embodiment of the inventive concept may use a clock only in aligning phases of parallel data signals A to D and may exclude the use of the clock through a circuit composed of logic gates at serialization, thereby reducing a circuit area, circuit complexity, and power consumption.

The serializer 100 according to an embodiment of the inventive concept may perform phase alignment with respect to the parallel data signals A to D while converting a plurality of parallel data signals A to D in the RZ manner. The serializer 100 may generate positive and negative toggle signals $T_P$ and $T_N$ based on the phase-aligned data signals A to D of the RZ manner, and may convert the toggle signal $T_P$ and the toggle signal $T_N$ into the serial data signal $D_P$ and the inverted serial data signal DN, respectively.

According to another embodiment of the inventive concept to be described later, the serializer 100 may perform phase alignment with respect to the parallel data signals A to D while converting a plurality of parallel data signals A to D in not the RZ manner but the RO manner. The serializer 100 may generate positive and negative toggle signals $T_P$ and $T_N$ based on the phase-aligned data signals A to D of the RZ manner, and may convert the toggle signal $T_P$ and the toggle signal $T_N$ into the serial data signal $D_P$ and the inverted serial data signal DN, respectively.

Figure 11:
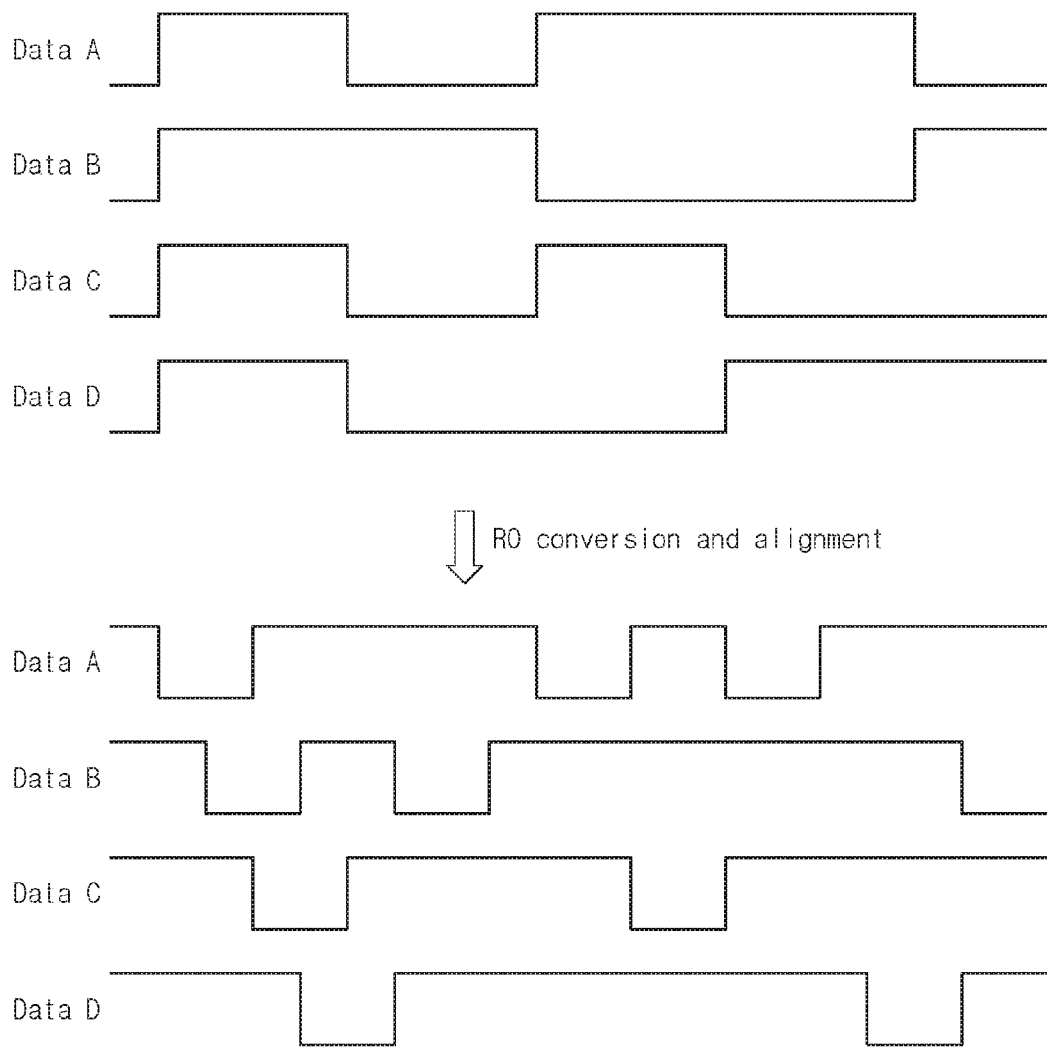
FIG. 11 is a diagram for describing the procedure in which a data signal alignment unit according to an embodiment of the inventive concept aligns data signals while converting the data signals in an RO manner.

FIG. 11 is a diagram for describing the procedure in which a data signal alignment unit 110 according to an embodiment of the inventive concept aligns data signals while converting the data signals in an RO manner.

According to another embodiment of the inventive concept, like an embodiment of FIG. 2, the data signal alignment unit 110 may sequentially align a plurality of data signals A to D with a predetermined phase interval, that is, 90 degrees and may convert the data signals A to D, expressed in the NRZ manner, in the RO manner.

Accordingly, as illustrated in FIG. 11, the data signals A to D may be arranged with 90 degrees in order of first to fourth data signals A to D, and a pulse may be implemented on the basis of a voltage corresponding to a logic level of "1".

In an embodiment, the data signal alignment unit 110 may include a plurality of flip-flops 111 to 114. However, the flip-flops 111 to 114 may be designed on the basis of a voltage corresponding to a logic level of "1", not a voltage corresponding to a logic level of "0".

For example, the data signal alignment unit 110 may include a plurality of flip-flops 111 to 114. Each flip-flop may receive a data signal D, a clock signal CLK, and a reset signal RST and may output an RO data signal Q, converted according to the RO manner, and an inverted RO data signal /Q, corresponding to an inverted version of the RO data signal Q, in response to the clock signal CLK and the reset signal RST.

Also, a phase difference corresponding to the phase interval (e.g., 90 degrees in the case of FIG. 11) may exist among the clock signals CLK respectively applied to the flip-flops 111 to 114, and a phase difference corresponding to the phase interval (e.g., 90 degrees in the case of FIG. 11) may exist among the reset signals RST respectively applied to the flip-flops 111 to 114.

In an embodiment, the transition detection unit 120 may generate toggle signals $T_P$ and $T_N$ by comparing logic levels, of which the phases are continuous, among aligned data signals A to D at the same timing. Unlike the transition detection unit 120 according to an embodiment of the inventive concept, the transition detection unit 120 may generate a positive toggle signal $T_P$ when a logic level of a data signal of which the phase leads is "1" and a logic level of a data signal of which the phase lags is "0" and may generate a negative toggle signal $T_N$ when a logic level of a data signal of which the phase leads is "0" and a logic level of a data signal of which the phase lags is "1".

Figure 12:
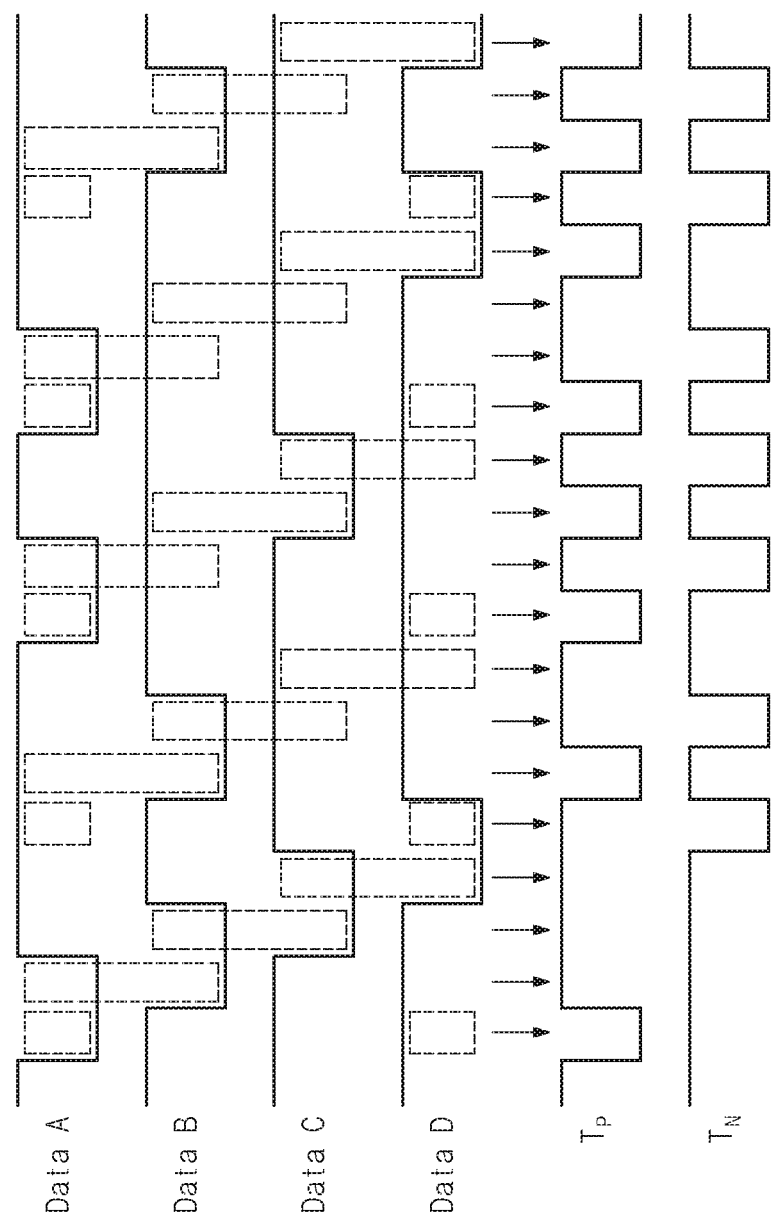
FIG. 12 is a diagram for describing the procedure in which a transition detection unit according to an embodiment of the inventive concept detects a transition of a logic level among data signals and generates toggle signals as the detection result.

FIG. 12 is a diagram for describing the procedure in which a transition detection unit 120 according to an embodiment of the inventive concept detects a transition of a logic level among data signals A to D and generates toggle signals $T_P$ and $T_N$ as the detection result.

As illustrated in FIG. 12, the transition detection unit 120 according to another embodiment of the inventive concept may compare logic levels of two data signals among data signals A to D of the RO manner, aligned with a predetermined phase interval, in order of phase at the same timing.

The transition detection unit 120 may generate a positive toggle signal $T_P$ when a logic level of a data signal of which the phase leads is "1" and a logic level of a data signal of which the phase lags is "0" and may generate a negative toggle signal $T_N$ when a logic level of a data signal of which the phase leads is "0" and a logic level of a data signal of which the phase lags is "1".

For example, referring to FIG. 12, in a first comparing step, since a fourth data signal D and a first data signal A have a logic level of "1" and a logic level of "1", respectively, the transition detection unit 120 may generate the positive toggle signal TP. On the other hand, in a fifth comparing step, since the fourth data signal D and the first data signal A have a logic level of "0" and a logic level of "1", respectively, the transition detection unit 120 may generate the negative toggle signal $T_N$.

According to an embodiment of the inventive concept, as illustrated in FIG. 12, the positive and negative toggle signals $T_P$ and $T_N$ may be also composed of pulses on the basis of a voltage corresponding to a logic level of "1".

Figure 13:
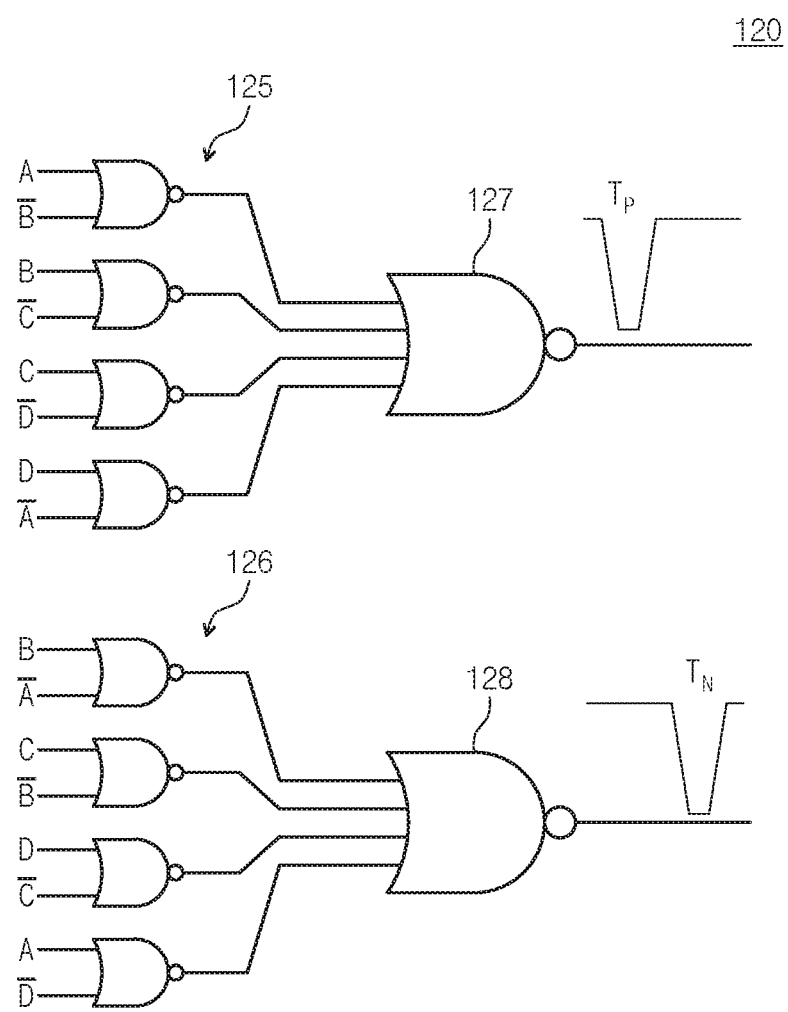
FIG. 13 is a circuit diagram illustrating a configuration of a transition detection unit according to another embodiment of the inventive concept.

FIG. 13 is a circuit diagram illustrating a configuration of a transition detection unit 120 according to another embodiment of the inventive concept.

The transition detection unit 120 according to an embodiment of the inventive concept may be implemented with a combination of NAND gates, but the transition detection unit according to another embodiment of the inventive concept may be implemented with a combination of NOR gates.

For example, as illustrated in FIG. 13, the transition detection unit 120 according to another embodiment of the inventive concept may include a plurality of first NOR gates 125, each of which receives two data signals, of which the phases are continuous, from among the aligned data signals A to D and performs a NOR operation with respect to an RO data signal of a data signal, of which the phase leads, and an inverted RO data signal of a data signal of which the phase lags; a plurality of second NOR gates 126, each of which receives two data signals, of which the phases are continuous, from among the aligned data signals A to D and performs a NOR operation with respect to an inverted RO data signal of a data signal, of which the phase leads, and an RO data signal of a data signal of which the phase lags; a third NOR gate 127 which performs a NOR operation with respect to output signals of the first NOR gates 125; and a fourth NOR gate 128 which performs a NOR operation with respect to output signals of the second NOR gates 126.

As such, the transition detection unit 120 according to another embodiment of the inventive concept may receive RO data signals A, B, C, and D and inverted RO data signals /A, /B, /C, and /D of the aligned data signals A, B, C, and D from the data signal alignment unit 110 and may detect a transition of a logic level to generate toggle signals $T_P$ or $T_N$.

Figure 14:
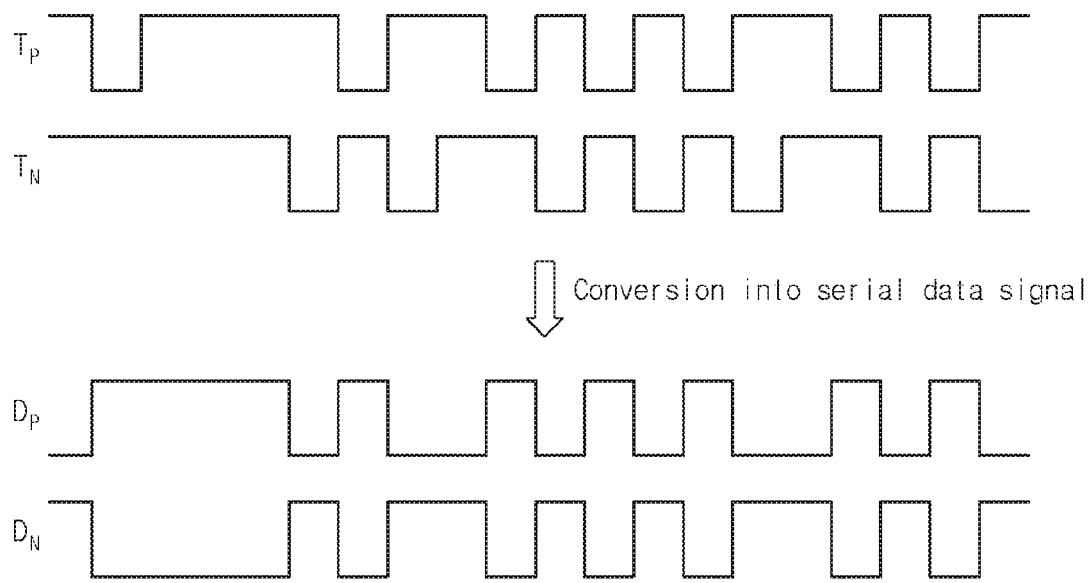
FIG. 14 is a diagram for describing the procedure in which a toggle signal conversion unit according to another embodiment of the inventive concept converts toggle signals into a serial data signal.

FIG. 14 is a diagram for describing the procedure in which a toggle signal conversion unit 130 according to another embodiment of the inventive concept converts toggle signals $T_P$ and $T_N$ into a serial data signal DP.

As illustrated in FIG. 14, the toggle signal conversion unit 130 may generate a serial data signal DP, in which pulses are implemented on the basis of a voltage corresponding to a logic level of "0", and an inverted serial data signal DN, which is obtained by inverting the serial data signal DP, based on positive and negative toggle signals $T_P$ and $T_N$ in which pulses are implemented on the basis of a voltage corresponding to a logic level of "1".

Figure 15:
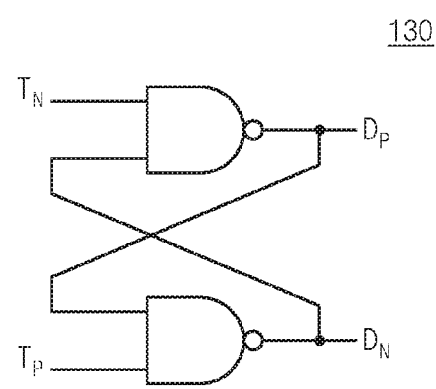
FIGS. 15 and 16 are circuit diagrams illustrating a configuration of a toggle signal conversion unit 130 according to another embodiment of the inventive concept.
Figure 16:
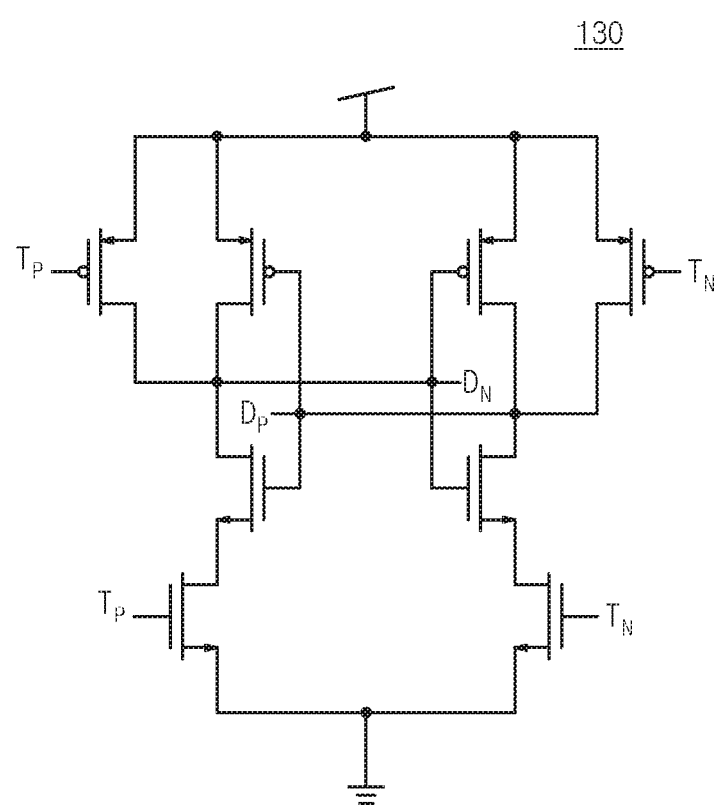

FIGS. 15 and 16 are circuit diagrams illustrating a configuration of a toggle signal conversion unit 130 according to another embodiment of the inventive concept.

According to an embodiment described above, the toggle signal conversion unit 130 may be implemented with an SR latch and may generate a serial data signal $D_P$ and an inverted serial data signal DN from the positive and negative toggle signals $T_P$ and $T_N$ using the SR latch.

Unlike an embodiment using the SR latch composed of NOR gates, another embodiment of the inventive concept may use an SR latch composed of NAND gates. An embodiment in which a NAND gate SR latch is implemented with PMOS and NMOS transistors is illustrated in FIG. 16.

Figure 17:
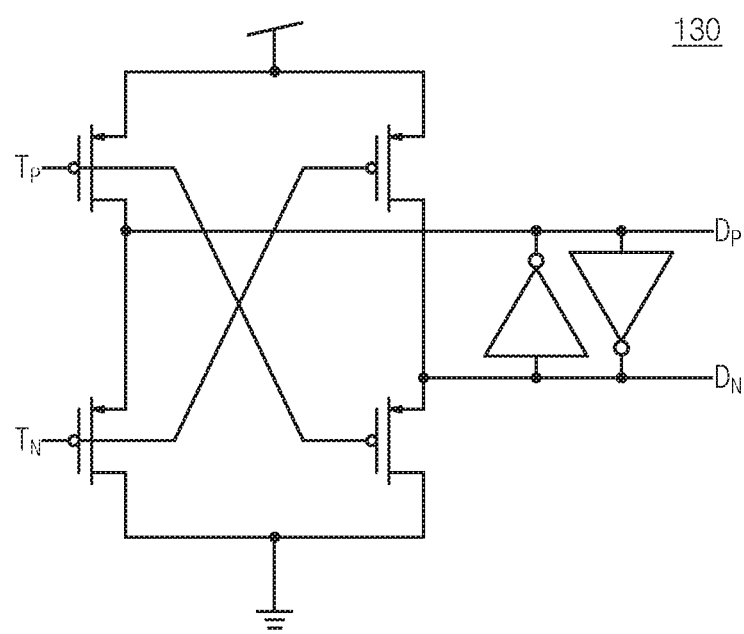
FIGS. 17 and 18 are circuit diagrams illustrating a configuration of a toggle signal conversion unit according to another embodiment of the inventive concept.
Figure 18:
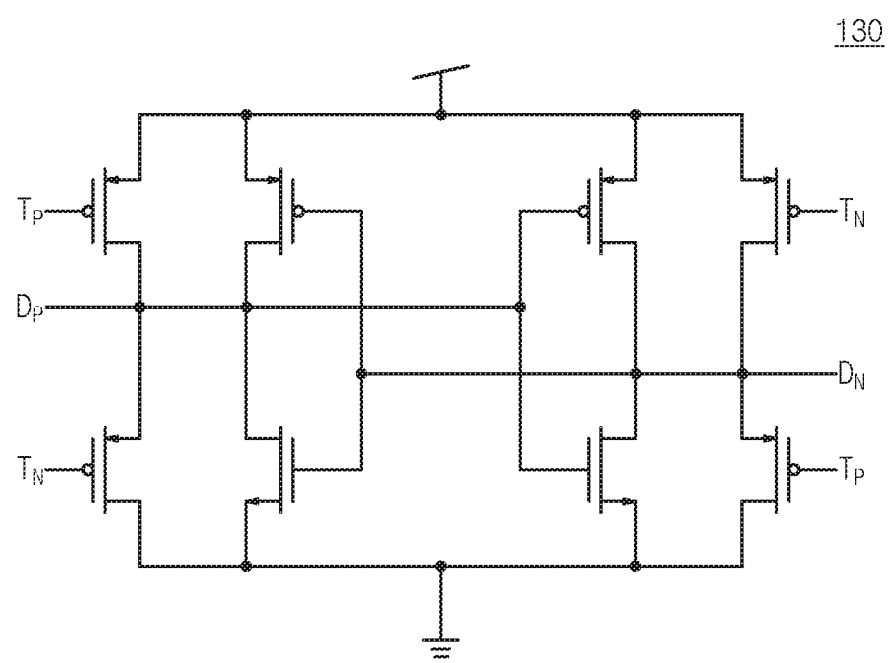

FIGS. 17 and 18 are circuit diagrams illustrating a configuration of a toggle signal conversion unit 130 according to another embodiment of the inventive concept.

Unlike a NAND gate SR latch of a 3-stack structure illustrated in FIGS. 15 and 16, the toggle signal conversion unit 130 illustrated in FIGS. 17 and 18 may have a 2-stack structure. The toggle signal conversion unit 130 may receive toggle signals $T_P$ and $T_N$ only by PMOS transistors and may include two inverters.

As such, the toggle signal conversion unit 130 may receive positive and negative toggle signals $T_P$ and $T_N$ through an SR latch, which are able to be implemented with various circuit structures, and may generate a serial data signal $D_P$ and an inverted serial data signal DN based on information about a transition of a logic level among parallel data signals A to D.

Figure 19:
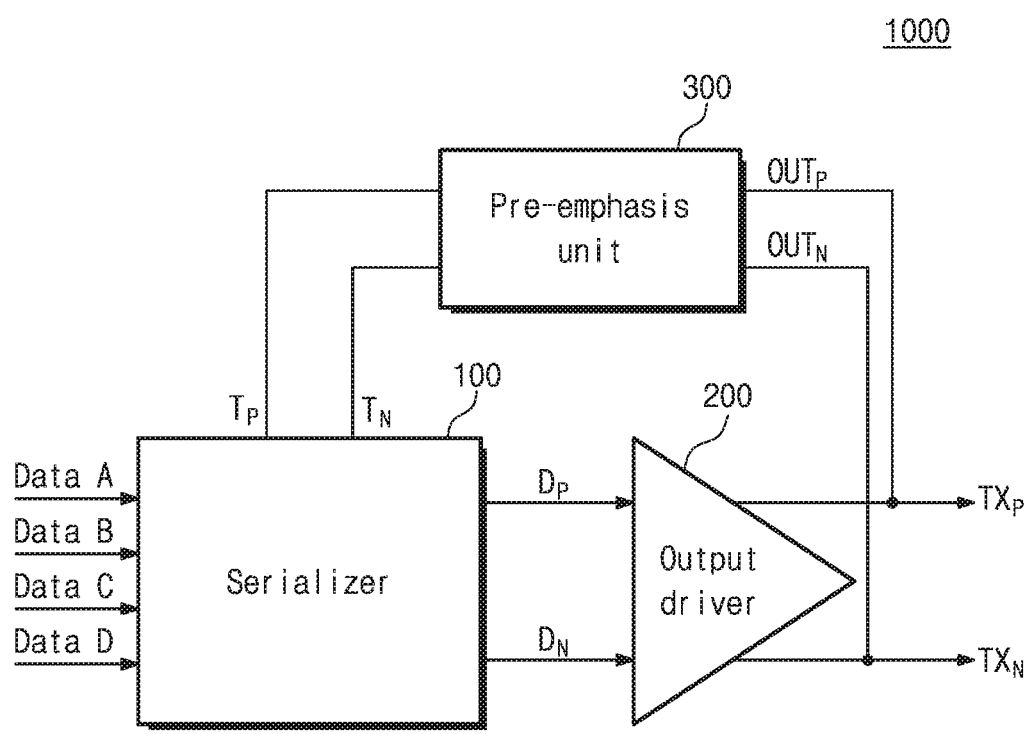
FIG. 19 is a block diagram illustrating a transmitter according to an embodiment of the inventive concept.

FIG. 19 is a block diagram illustrating a transmitter 1000 according to an embodiment of the inventive concept.

As illustrated in FIG. 19, a data transmitter 1000 may include a serializer 100, an output driver 200, and a pre-emphasis unit 300.

The data transmitter 1000 may include the serializer 100 according to an embodiment of the inventive concept. That is, the serializer 100 may include a data signal alignment unit 110 aligning a plurality of data signals A to D with a predetermined phase interval (e.g., 90 degrees in the case of FIG. 19), a transition detection unit 120 detecting a transition of a logic level among the aligned data signals A to D and generating toggle signals $T_P$ and $T_N$ when the logic level transitions, and a toggle signal conversion unit 130 converting the toggle signals $T_P$ and $T_N$ into a serial data signal $D_P$ which is obtained by serializing the data signals A to D and may convert the parallel data signals A to D into a serial data stream DP.

The output driver 200 may compensate for a channel loss of the serial data signal DP. For example, the output driver 200 may be implemented at an output stage of the data transmitter 1000 and may increase a power of an output signal by increasing the amount of current with a voltage level of a data signal maintained. Furthermore, the output driver 200 may perform impedance matching such that an output impedance of the data transmitter 1000 is set with 50 ohms.

The pre-emphasis unit 300 may boost a high-frequency band of the output signal of the output driver 200 may perform a pre-emphasis function.

According to an embodiment of the inventive concept, the pre-emphasis unit 300 may receive a toggle signal from the serializer 100 to generate an emphasis signal in a section in which the toggle signal is received and may make the emphasis signal overlapped with an output signal from the output driver 200. In other words, the pre-emphasis unit 300 may use toggle signals $T_P$ and $T_N$, which the serializer 100 generates, in pre-emphasizing the output signals $D_P$ and DN.

Figure 20:
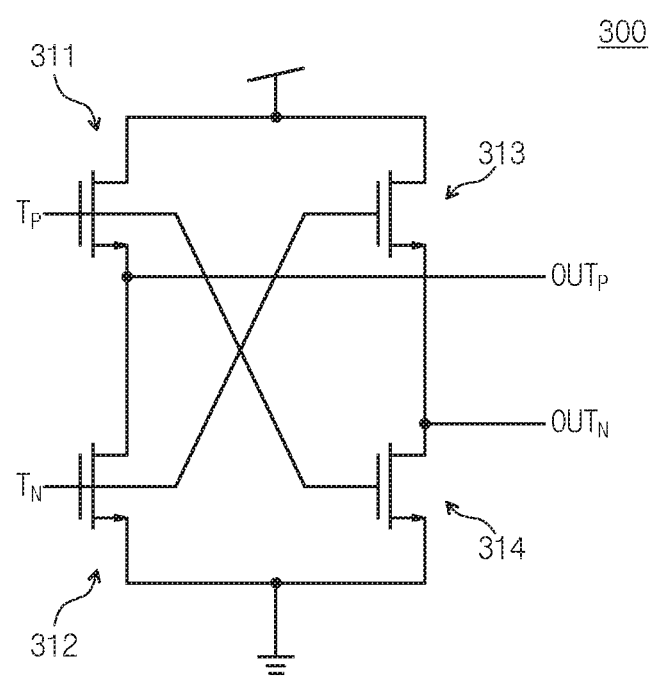
FIG. 20 is a circuit diagram illustrating a pre-emphasis unit according to an embodiment of the inventive concept.

FIG. 20 is a circuit diagram illustrating a pre-emphasis unit 300 according to an embodiment of the inventive concept.

The pre-emphasis unit 300 illustrated in FIG. 20 may generate emphasis signals $OUT_P$ and $OUT_N$ for pre-emphasis using positive and negative toggle signals $T_P$ and $T_N$ generated by the serializer 100 (i.e., a serializer of FIGS. 2 to 10 performing serialization based on data signals of an RZ manner).

As illustrated in FIG. 20, the pre-emphasis unit 300 may include first and second switching elements 311 and 312 connected in series between a first power terminal VDD, having a potential corresponding to a logic level of "1", and a second power terminal GND, having a potential corresponding to a logic level of "0", and third and fourth switching elements 313 and 314 connected in series between the first power terminal VDD and the second power terminal GND.

The first and fourth switching elements 311 and 314 may be switched on or off according to a positive toggle signal TP, and the second and third switching elements 312 and 313 may be switched on or off according to a negative toggle signal $T_N$.

According to an embodiment, the first to fourth switching elements 311 to 314 may be implemented with NMOS transistors, respectively. When the toggle signals $T_P$ and $T_N$ are applied to corresponding gates of the NMOS transistors, the emphasis signals $OUT_P$ and $OUT_N$ may be outputted from the first power terminal VDD and the second power terminal GND.

Figure 21:
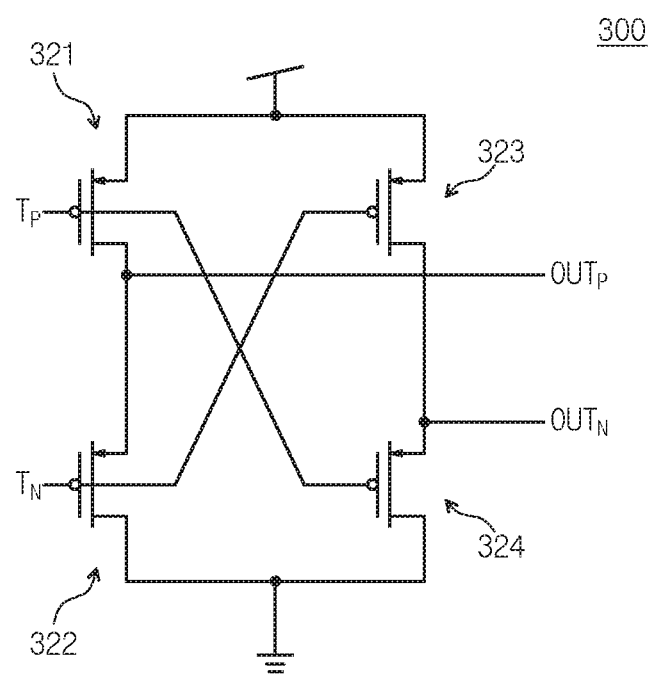
FIG. 21 is a circuit diagram illustrating a pre-emphasis unit according to another embodiment of the inventive concept.

FIG. 21 is a circuit diagram illustrating a pre-emphasis unit 300 according to another embodiment of the inventive concept.

The pre-emphasis unit 300 illustrated in FIG. 21 may generate emphasis signals $OUT_P$ and $OUT_N$ for pre-emphasis using positive and negative toggle signals $T_P$ and $T_N$ generated by the serializer 100 (i.e., a serializer of FIGS. 11 to 10 performing serialization based on data signals of an RO manner).

As illustrated in FIG. 21, the pre-emphasis unit 300 may include first and second switching elements 321 and 322 connected in series between a first power terminal VDD, having a potential corresponding to a logic level of "1", and a second power terminal GND, having a potential corresponding to a logic level of "0", and third and fourth switching elements 323 and 324 connected in series between the first power terminal VDD and the second power terminal GND.

The first and fourth switching elements 321 and 324 may be switched on or off according to a positive toggle signal TP, and the second and third switching elements 322 and 323 may be switched on or off according to a negative toggle signal $T_N$.

According to an embodiment, the first to fourth switching elements 321 to 324 may be implemented with PMOS transistors, respectively. When the toggle signals $T_P$ and $T_N$ are applied to corresponding gates of the PMOS transistors, the emphasis signals $OUT_P$ and $OUT_N$ may be outputted from the first power terminal VDD and the second power terminal GND.

The emphasis signals $OUT_P$ and $OUT_N$ emphasized by the pre-emphasis unit 300 may be overlapped with a signal output from the output driver 200, that is, a serial data signal $D_P$ and an inverted serial data signal DN. That is, pre-emphasis may be performed.

As such, the pre-emphasis unit 300 according to an embodiment of the inventive concept may pre-emphasize an output signal using toggle signals $T_P$ and $T_N$ generated during data serialization, and thus a separate circuit block for detecting a pulse edge of the output signal may not be required. This may mean that power consumption of the data transmitter 1000 is additionally reduced as a circuit block for pre-emphasis is simply configured.

According to an embodiment of the inventive concept, power consumption may be reduced by excluding the use of clock during data serialization.

According to an embodiment of the inventive concept, complexity of design may be lowered by implementing a circuit block needed for data serialization with logic gates using a standard cell.

According to an embodiment of the inventive concept, pre-emphasis may be provided through a simple circuit block by pre-emphasizing a serial data signal using a toggle signal generated during data serialization.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A serializer, comprising:
a data signal alignment unit aligning a plurality of data signals with a predetermined phase interval;
a transition detection unit detecting a transition of a logic level among the aligned data signals to generate a toggle signal at a transition of the logic level; and
a toggle signal conversion unit converting the toggle signal into a serial data signal obtained by serializing the data signals,
wherein the transition detection unit compares logic levels of two data signals, of which the phases are continuous, from among the aligned data signals at a same timing, generates a positive toggle signal or a negative toggle signal based on a comparison result of the logic levels of two data signal,
wherein the toggle signal conversion unit receives the positive toggle signal or the negative toggle signal, and outputs the serial data signal and an inverted serial data signal corresponding to an inverted version of the serial data signal.

2. The serializer of claim 1, wherein the data signal alignment unit aligns the plurality of data signals so as to be spaced apart from each other by a phase difference which corresponds to a value obtained by dividing 360 degrees by the number of the data signals.

3. The serializer of claim 1, wherein the data signal alignment unit aligns the plurality of data signals so as to have the phase interval while converting the plurality of data signals in a return to zero (RZ) manner.

4. The serializer of claim 3, wherein the transition detection unit generates the positive toggle signal when a logic level of a data signal of which a phase leads is "0" and a logic level of a data signal of which a phase lags is "1", and generates the negative toggle signal when a logic level of a data signal of which the phase leads is "1" and a logic level of a data signal of which the phase lags is "0".

5. The serializer of claim 4, wherein the toggle signal conversion unit comprises:
a NOR gate SR latch receiving the positive toggle signal and the negative toggle signal and outputting the serial data signal and the inverted serial data signal corresponding to the inverted version of the serial data signal.

6. The serializer of claim 1, wherein the data signal alignment unit aligns the plurality of data signals so as to have the phase interval while converting the plurality of data signals in a return to one (RO) manner.

7. The serializer of claim 6, wherein the transition detection unit generates the positive toggle signal when a logic level of a data signal of which a phase leads is "1" and a logic level of a data signal of which a phase lags is "0", and generates the negative toggle signal when a logic level of a data signal of which a phase leads is "0" and a logic level of a data signal of which a phase lags is "1".

8. The serializer of claim 7, wherein the toggle signal conversion unit comprises:
a NAND gate SR latch receiving the positive toggle signal and the negative toggle signal and outputting the serial data signal and an inverted serial data signal corresponding to an inverted version of the serial data signal.

9. The serializer of claim 1,
further comprising: a pre-emphasis unit receiving the toggle signal, generating an emphasis signal in an input section of the toggle signal, and making the emphasis signal overlapped with an output signal.

10. A serializer, comprising:
a data signal alignment unit aligning a plurality of data signals with a predetermined phase interval;
a transition detection unit detecting a transition of a logic level among the aligned data signals to generate a toggle signal at a transition of the logic level; and
a toggle signal conversion unit converting the toggle signal into a serial data signal obtained by serializing the data signals,
wherein the data signal alignment unit aligns the plurality of data signals so as to have the phase difference while converting the plurality of data signals in a return to zero (RZ) manner,
wherein the data signal alignment unit comprises a plurality of flip-flops, each of which receives a data signal, a clock signal, and a reset signal and outputs an RZ data signal, obtained by converting the data signal in the RZ manner, and an inverted RZ data signal, corresponding to an inverted version of the RZ data signal, in response to a timing of the clock signal and the reset signal,
wherein a phase difference corresponding to the phase interval exists among the clock signals respectively applied to the flip-flops, and
wherein a phase difference corresponding to the phase interval exists among the reset signals respectively applied to the flip-flops.

11. The serializer of claim 10, wherein the transition detection unit comprises:
a plurality of first NAND gates, each of which receives two data signals, of which phases are continuous, from among the aligned data signals and performs a NAND operation with respect to an RZ data signal of a data signal, of which a phase leads, and an inverted RZ data signal of a data signal of which a phase lags;
a plurality of second NAND gates, each of which receives two data signals, of which phases are continuous, from among the aligned data signals and performs a NAND operation with respect to an inverted RZ data signal of a data signal, of which a phase leads, and an RZ data signal of a data signal of which a phase lags;
a third NAND gate performing a NAND operation with respect to output signals of the first NAND gates; and
a fourth NAND gate performing a NAND operation with respect to output signals of the second NAND gates.

12. A serializer, comprising:
a data signal alignment unit aligning a plurality of data signals with a predetermined phase interval;
a transition detection unit detecting a transition of a logic level among the aligned data signals to generate a toggle signal at a transition of the logic level; and
a toggle signal conversion unit converting the toggle signal into a serial data signal obtained by serializing the data signals,
wherein the data signal alignment unit aligns the plurality of data signals so as to have the phase interval while converting the plurality of data signals in a return to one (RO) manner,
wherein the data signal alignment unit comprises:
a plurality of flip-flops, each of which receives a data signal, a clock signal, and a reset signal and outputs an RO data signal, obtained by converting the data signal in the RO manner, and an inverted RO data signal, corresponding to an inverted version of the RO data signal, in response to a timing of the clock signal and the reset signal,
wherein a phase difference corresponding to the phase interval exists among the clock signals respectively applied to the flip-flops, and
wherein a phase difference corresponding to the phase interval exists among the reset signals respectively applied to the flip-flops.

13. The serializer of claim 12, wherein the transition detection unit comprises:
a plurality of first NOR gates, each of which receives two data signals, of which phases are continuous, from among the aligned data signals and performs a NOR operation with respect to an RO data signal of a data signal, of which a phase leads, and an inverted RO data signal of a data signal of which a phase lags;
a plurality of second NOR gates, each of which receives two data signals, of which the phases are continuous, from among the aligned data signals and performs a NOR operation with respect to an inverted RO data signal of a data signal, of which a phase leads, and an RO data signal of a data signal of which a phase lags;
a third NOR gate which performs a NOR operation with respect to output signals of the first NOR gates; and
a fourth NOR gate which performs a NOR operation with respect to output signals of the second NOR gates.

* * * * *